United States Patent [19]
Veyrier et al.

[11] Patent Number: 5,834,778
[45] Date of Patent: Nov. 10, 1998

[54] METHOD FOR ASSEMBLING A DETECTION UNIT FOR ELECTROMAGNETIC AND IN PARTICULAR INFRARED WAVES WITH A THERMALLY CONDUCTING SUBSTRATE AND AN ELECTROMAGNETIC AND IN PARTICULAR AN INFRARED DETECTOR WITH WHICH TO IMPLEMENT THIS METHOD

[75] Inventors: Jacques Veyrier, Saint Egreve; Serge Magli, Eybens, both of France

[73] Assignee: Societe Francaise de Detecteurs Infrarouges-SOFRADIR, France

[21] Appl. No.: 686,424

[22] Filed: Jul. 26, 1996

[30] Foreign Application Priority Data

Aug. 2, 1995 [FR] France ................... 95 09631

[51] Int. Cl.⁶ .................................... G01J 5/06
[52] U.S. Cl. ..................... 250/352; 250/370.15
[58] Field of Search .................. 250/352, 332, 250/370.08, 370.15

[56] References Cited

U.S. PATENT DOCUMENTS

| | | |
|---|---|---|
| 4,954,708 | 9/1990 | Salzer et al. . |
| 5,103,097 | 4/1992 | Montanari ............................. 250/332 |
| 5,111,050 | 5/1992 | Maassen et al. . |
| 5,264,699 | 11/1993 | Barton et al. . |
| 5,308,980 | 5/1994 | Barton ............................. 250/332 X |
| 5,585,624 | 12/1996 | Asatourian et al. ........... 250/370.08 X |
| 5,600,140 | 2/1997 | Asatourian ........................... 250/352 X |
| 5,610,389 | 3/1997 | Asatourian ..................... 250/370.08 X |

FOREIGN PATENT DOCUMENTS

| | | |
|---|---|---|
| 0 464 893 A1 | 1/1992 | European Pat. Off. . |
| 0 419 371 A1 | 3/1991 | France . |
| 0 485 312 A1 | 5/1992 | France . |

OTHER PUBLICATIONS

Patent Abstracts of Japan, vol. 012, No. 265 (E–637), 23 Juillet 1988, & JP–A–63–050046 (Toshiba Corp), 2 Mars 1988.

*Primary Examiner*—Edward J. Glick
*Attorney, Agent, or Firm*—Parkhurst & Wendel, L.L.P.

[57] ABSTRACT

An electromagnetic detection unit for detecting infrared radiation having an electronic detection circuit with a readout joined thereto by indium microspheres, and further having a thermally conducting support, affixed to a cold source, having a good thermally conducting intermediary component located thereon and fastened to a detection unit by adhesive bonding and to the support by adhesive or brazing wherein the dimensions of the elements of the intermediary component are selected to compensate for the intrinsic effects of differential expansion of each of the constituent materials.

11 Claims, 3 Drawing Sheets

METHOD FOR ASSEMBLING A DETECTION UNIT FOR ELECTROMAGNETIC AND IN PARTICULAR INFRARED WAVES WITH A THERMALLY CONDUCTING SUBSTRATE AND AN ELECTROMAGNETIC AND IN PARTICULAR AN INFRARED DETECTOR WITH WHICH TO IMPLEMENT THIS METHOD

The present invention concerns a method for assembling a detection unit for electromagnetic and in particular infrared waves with a thermally conducting support. The invention further relates to a detector for such electromagnetic and in particular infrared waves with which to implement said method.

By detection unit, it is meant the assembly composed on one hand, of an electronic circuit proper for detecting electromagnetic waves, which in known manner transduces electromagnetic radiation into an electrical signal, associated with a readout circuit that is able to transform the electric output signals from the detection circuit, notably by amplifying them to allow subsequent processing.

Within the scope of infrared-radiation detection, it is well known that the detection circuit, for example composed of strips or matrices of photodiodes, must operate at low temperatures, to with in a range between 50° and 200° Kelvins (K). In fact, these detection circuits as a rule are installed inside a cryostatic enclosure (the cryostat), of which the cold conduit contains, depending on the circuit's application, liquid nitrogen or liquid air or any other cryogenic cooling means.

As a consequence of the various improvements in infrared detectors, they are advantageously hybridized, that is, the actual infrared detection circuit is coupled to the readout circuit by indium microspheres, thus making possible substantial compactness, and in particular maximizing the simplification of the connections between the various circuits. In such a case, the detection circuit must allow that the photo-sites be illuminated from the rear side. Moreover, in some configurations of large and complex systems, there are also readout and detection circuits which are electrically connected to each other by hybridization to a common connection circuit. In either case, the operation and the end result of the invention are unchanged. In both cases, there will be a detection unit.

The detection unit so defined is therefore in permanent thermal heat exchange with the cold plane, that is the end of the cold conduit of the cryostat, the latter being sealed thereby, said detection unit, and in particular the readout circuit being mechanically and thermally held in contact with the cold plane by an interface which generally is a ceramic support, ensuring also the function of an electric connector between the detection unit and the cryostat. The junction between said support and the detection unit is implemented by an adhesive joint, electrically conducting or insulating, and in the former case, for instance being composed of epoxy resin with a metal filler, to ensure electrical conduction between the rear side of the detection unit and more specifically the readout circuit and the connection of this ceramic interface.

In general this connection system consists of engraved or silk-screened metal conductors on this intermediate ceramic support. Furthermore, this ceramic support itself is affixed by an adhesive joint, usually silicone, on the cold cryostat plane.

FIG. 1 shows an illustrative embodiment representing one of the specimens of the prior art. It denotes by 1 the infrared detector fitted with its cooling system, and in particular its cold conduit 4. The input stage to this detector consists of a filter 2, for selecting the desired wavelength bands, and centered on the optic axis of said detector. In all cases, this window 2 assures the hermetic sealing of the cryostat.

The cold conduit 4 of the cooling system is fitted at its upper end with a cold plane 5 sealingly affixed to it and made of a material with good thermal conductivity. An intermediate support 6 is associated to this cold plane 5 to which it is bonded by an omitted adhesive glue joint, as a rule silicone, and said support 6 acts as interconnection circuit generally made of ceramics, especially alumina, and allowing to electrically connect the readout circuit and the output connection system of the cryostat.

In practice, the readout circuit 7 is mounted on this intermediate support 6, in particular being bonded to it by an epoxy resin, in most cases electrically conducting, to assure, as called for, electrical contact with the rear side of the readout circuit. Lastly, the detection circuit 8 is mechanically joined and electrically connected by indium microspheres 9 to the readout circuit 7. The readout circuit 7, microspheres 9 and detection circuit 8 assembly is accordingly thermally connected to the cryostat cold plane 5.

Furthermore, to minimize stray radiation, a diaphragm 3 is affixed to the cold plane 5 or to the intermediate support 6, and accordingly this diaphragm is kept also at a low temperature.

It follows from the above that in the detectors of the prior art, the cold plane 5 assumes several functions: first of all a sealing function, on account of a hermetic seal or brazing between the cold conduit 4 and the cold plane 5; next, and in the case of an electrically insulating cold plane, an interconnecting function in view of the conductors deposited on its upper surface, in the manner described for instance in U.S. Pat. No. 5,111,050. In fact and in the case of a metal cold plane, ipso facto being electrically conducting, said plane assumes the function of a support for the interconnection network, generally composed of alumina, allowing electrical connection between the readout circuit and the cryostat output connection.

It can be seen with such detectors, subjected to consecutive coolings, differential expansions take place between the various materials constituting the focal plane, namely the assembly composed of the detection unit, the intermediate support and the cold plane. These phenomena entail warping in the focal plane, and as a consequence stresses and deformations in the indium microspheres, and in the long run the ensuing fatigue entails rupture of said microspheres.

Accordingly such rupturing of the indium microspheres degrades the mechanical strength of the detection circuit, and in particular causes a break in the continuity of the electrical contact between said detection circuit and the readout circuit, thereby degrading the operational reliability of the detector, and its performance.

In order to palliate this drawback, it has already been suggested, for instance in the already cited U.S. Pat. No. 5,111,050 to modify the entire detector cold plane in accordance with FIG. 2. In this case, the cold plane selected is composed of a material which better matches its expansion to the readout circuit 7 in the absence of any intermediate support. One such component 5 is made of aluminum nitride, and in such a case the readout circuit is made of silicon. Nevertheless, despite the use of such material, it is observed that sphere warping remains and that in the long run the spheres will rupture because of a residual discrepancy, however slight, between the coefficients of expansion of the cold plane and the readout circuit.

The object of the invention is freedom from these rupturing phenomena of the indium microspheres which are an intrinsic cause of the warping of the focal plane due to the differential expansions of the constituent materials of said focal plane.

According to the invention, the method used to assemble the detection unit, composed of an electronic circuit for detecting electromagnetic, and in particular infrared radiation, provided with a readout circuit, with a thermally conducting support or a cold plane joined to a cold source, at the interface of which is interposed a component which is also thermally conducting, and which is affixed by bonding both to the detection unit and to the cold plane, is characterized in that it imparts to the component(s) of said intermediary component one of the dimension(s), in particular one of the thickness(es) depending on that of the readout circuit in such manner as to compensate the intrinsic effects of thermal expansion of each of the constituent materials.

In other words, using such an intermediary component, it is possible to compensate the differential expansion effects of the diverse materials constituting the focal plane, and it is possible to minimize, even to eliminate, warping in the indium microspheres.

Said intermediary component may be integral or it may be constituted of several elements.

In a first embodiment of the invention, wherein the intermediary component is integral, said component preferably evinces a mean linear expansion coefficient larger than that of the constituent material of the readout circuit and also larger than that of the constituent material of the cold plane and hence in particular of the cold plane. Said component is made of a material from the group including polycrystalline alumina, sapphire, aluminum nitride etc.

The mean linear expansion coefficient is defined as the ratio of the integral of the relative length variation between the limits of ambient and operational temperatures, for instance the latter 77° K for the material under consideration to said temperature interval. Accordingly at 300° K, the mean coefficient of linear expansion $\alpha_{mean}$ is given by:

$$\alpha_{mean} = 1/300 - 77 \times \int_{77}^{300} dl/l$$

where l denotes the length.

In a second embodiment of the invention, wherein the intermediary component is constituted of several elements, typically of two mutually parallel plates, the constituent material of the upper plate in contact with the readout circuit evinces a mean linear expansion coefficient larger than that of the constituent material of said readout circuit and larger than the constituent material of the second plate of the intermediary component, that is the lower plate in contact with the cold plane. The mean linear expansion coefficient of said second plate is near that of the material of the readout circuit (in general silicon) and more specifically it is between $5 \times 10^{-7}$ and $1.8 \times 10^{-6}/°$ K. The constituent material of this second plate may be selected from the group including silicon, silicon carbide and aluminum nitride.

In both the above embodiment variations of the invention, the intermediary-component plate underneath the readout circuit is affixed to the latter using epoxy glue, possibly electrically conducting, whereas the other side is fitted with a silicone-glue joint, to bond it to the second or lower plate of this intermediary component, when the latter is constituted of several elements, or to the cold plane in the integral design. In the case of a multi-element design, the lower plate is affixed to the cold plane in any suitable manner, arbitrary bonding or brazing, such affixation being immaterial to the implementation of the invention.

The invention also relates to the detector with which to implement the invention. This detector for electromagnetic and in particular infrared radiation comprises:

a detection unit which incorporates:
a detection circuit;
a readout circuit electrically and mechanically connected by indium microspheres to said detection circuit;
a cold plane affixed to the cold conduit of a cryogenic system;
an intermediary component, adhesively bonded to the detection unit and to the cold plane.

This detector is characterized in that the intermediary component is integral and of dimensions, in particular of a thickness, depending on that of the readout circuit to which it is affixed, as to compensate the inherent differential expansion effects of each of the constituent materials, said component being joined by an epoxy-glue joint to the readout circuit, and by a silicone-glue joint to the cold plane.

In another embodiment mode, the detector is characterized in that the intermediary component is constituted of a plurality of elements, and comprises two mutually parallel plates, namely an upper plate, affixed by an epoxy-glue joint to the readout circuit, and a lower plate, affixed by a silicone-glue joint to said upper plate, and by an arbitrary means to the cold plane, the materials and the thicknesses of said plates depending on that of the readout circuit, in such manner as to compensate the intrinsic differential expansion effects of each constituent material.

The illustrative embodiment below, which implies no limitation and is illustrated in the attached Figures, elucidates the manner in which the invention can be carried out and the ensuing advantages it offers.

As already mentioned above, FIGS. 1 and 2 are schematic cross-sections of an infrared detector combined with the cold conduit of a prior-art cryostat.

Figure 1:
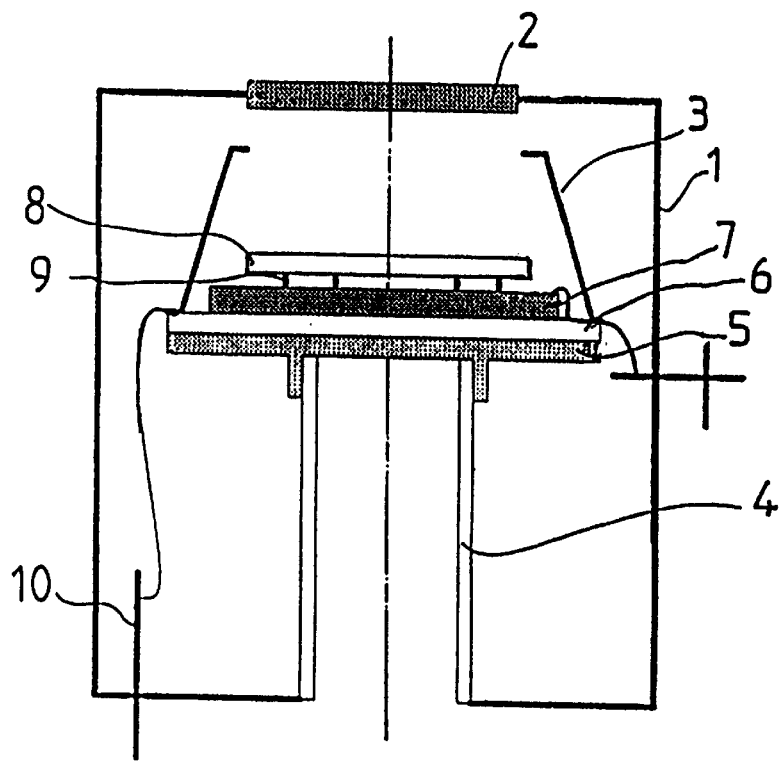
Figure 2:
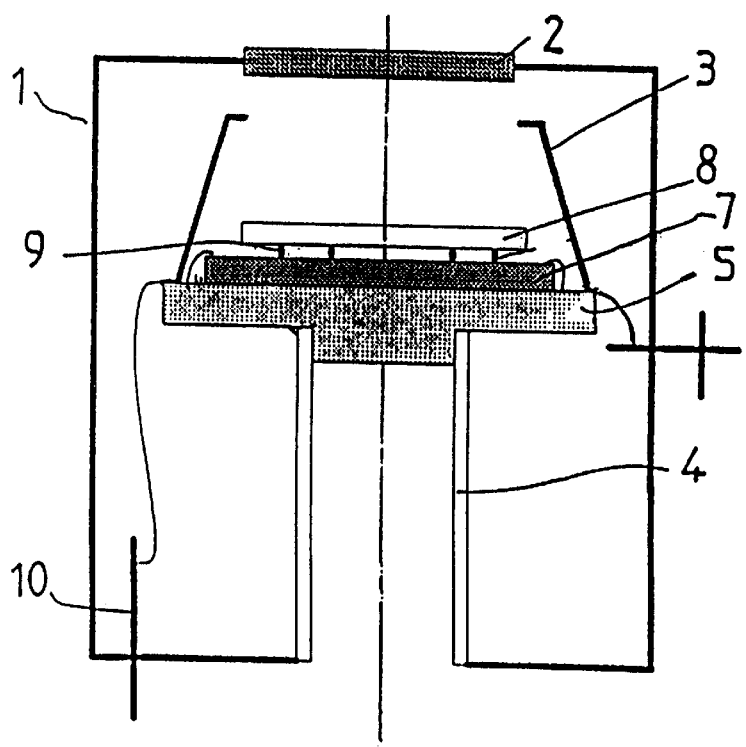
Figure 3:
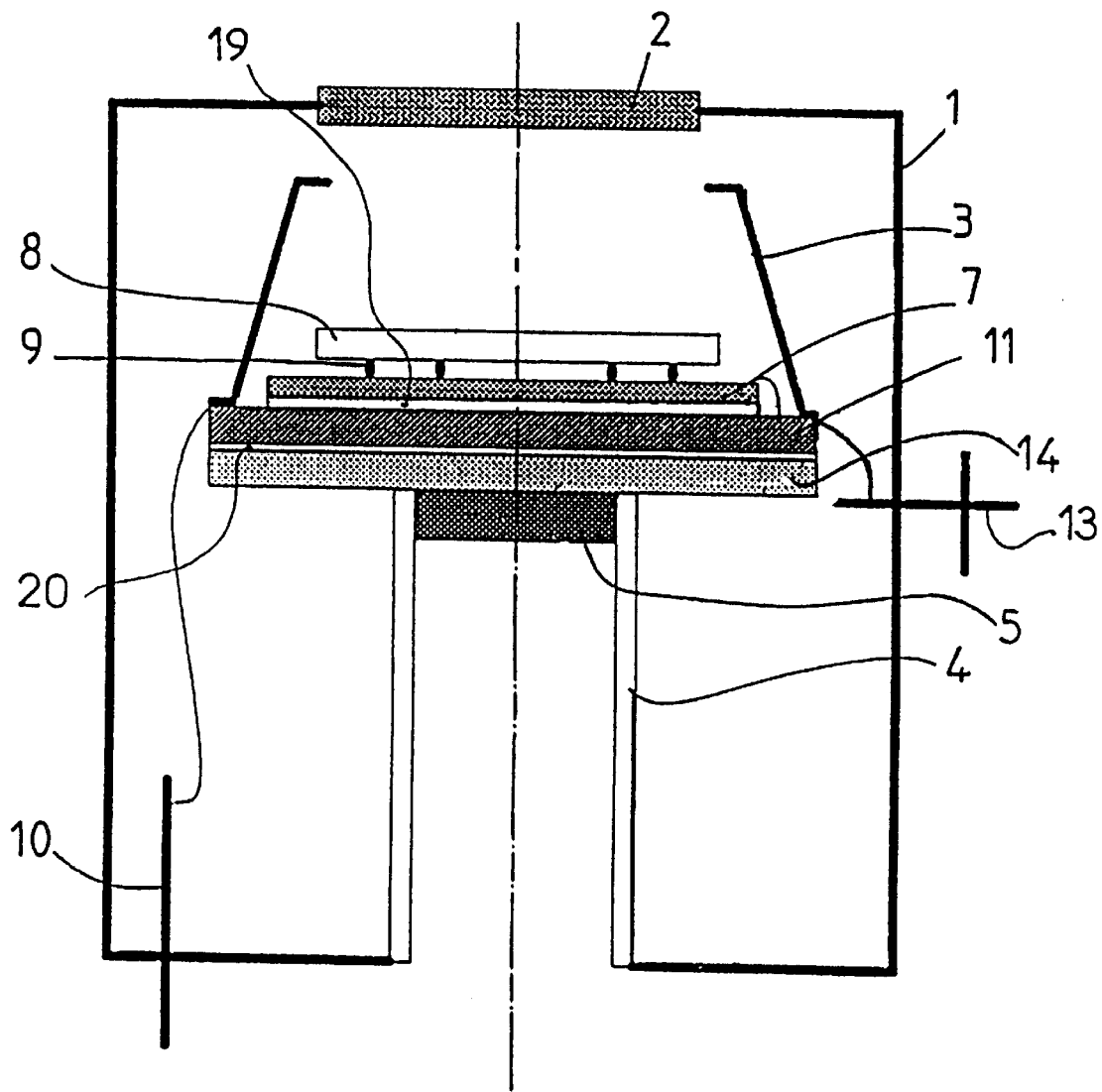
FIG. 3 is a cross-sectional schematic of an infrared detector of a first embodiment of the invention.
Figure 4:
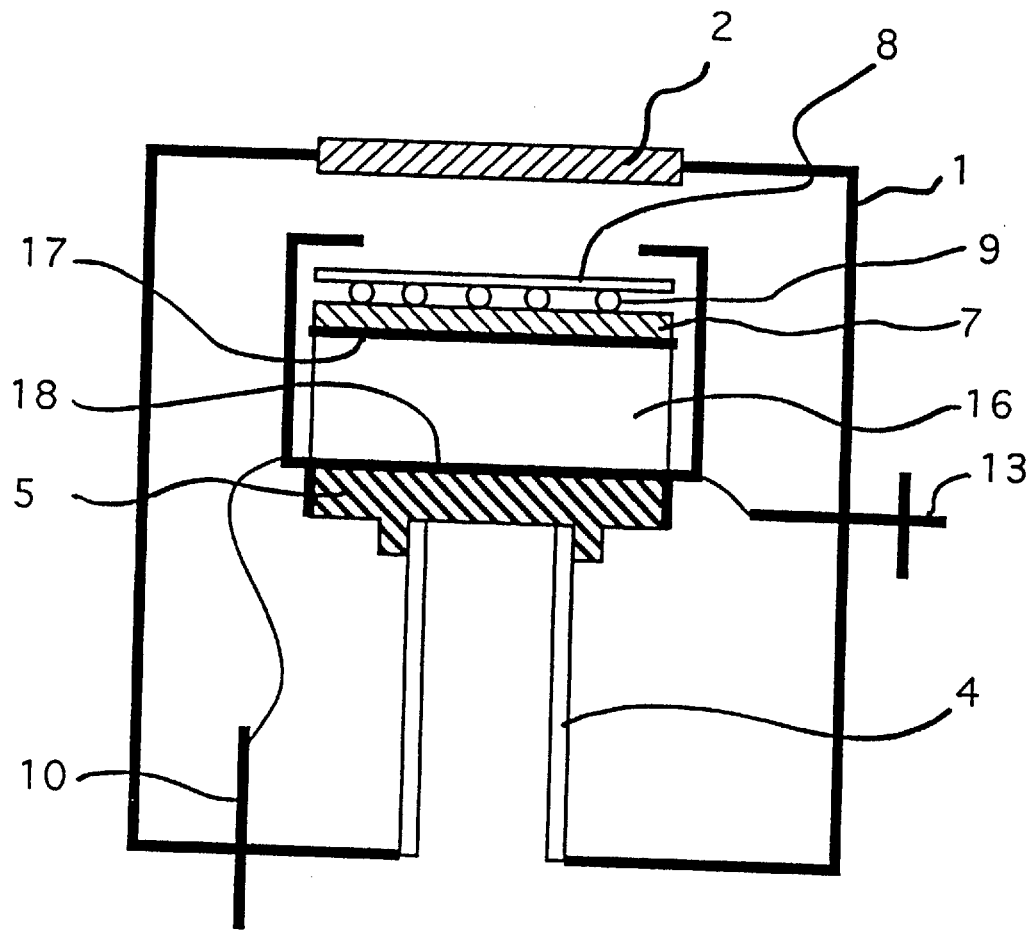
FIG. 4 is a cross-sectional schematic of an infrared detector of a second embodiment of the invention.

The basic components of the infrared detectors of FIGS. 3 and 4 of the invention already have been discussed and are referenced in the description of FIGS. 1 and 2 relating to the prior art.

Basically, and within the scope of a first embodiment of the invention shown in FIG. 3, wherein the intermediary component object of the invention is constituted of several elements, the detection unit, composed of the detection circuit 8, itself constituted of photodiode strips or matrices, is joined by indium microspheres 9 to the readout circuit 7, which in turn is joined to an intermediary composite component, comprising a sapphire plate 11, bonded by a silicone-glue joint 20 to an aluminum nitride plate 14, the free surface of the sapphire plate 11, namely its upper surface, being bonded by a conducting epoxy-glue joint 19 to the readout circuit 7, and the free surface of the aluminum-nitride plate 14, that is its lower surface, being glued or brazed to the plane 5 and acting as a seal for the cold conduit 4 of the cryostat.

The dielectric properties of the upper plate 11 illustratively made of sapphire, and a constituent of the intermediary component, allow fitting an interconnection network to its surface, between the detection circuit 7 and the electric inputs and outputs at the cryostat level, one of which is shown by the reference 10, and the other by the reference 13.

In a known manner, the composite intermediary component 11, 14 offers good thermal conductivity in order to propagate cold from the cold conduit toward the detection unit to which said component is affixed by glueing or brazing.

In an illustrative embodiment wherein the readout and detection circuit is constituted by a linear strip of 288 lines of four hybridized diodes per CCD silicon readout circuit, and of which the dimensions of the readout circuit 7 are 10×6×0.54 mm, a composite intermediary structure is introduced which consists, on one hand, of a sapphire plate 11 of which the dimensions are 10×11×1.27 mm, and which comprises on its upper surface in contact with the readout circuit a layer of epoxy glue 19 with metallic fillers, about 10 $\mu$ thick, and on the other hand, of an aluminum nitride plate 14, of which the dimensions are 16×11×0.6 mm, which is affixed by a layer of silicone glue 20 to the sapphire plate 11.

While the widths and lengths of the plates constituting the intermediary composite component 11, 14 are constrained by those of the readout circuit 7, on the other hand their thickness will depend on a number of considerations:

first, as regards the aluminum nitride plate 14, with a given thickness of the silicon of the readout circuit, that of the plate 14 is at least 110% of said thickness and advantageously shall be limited to twice that value. Modelling has shown that, beyond latter value, only minor gains are achieved, and that furthermore, considering the additional mass, the configuration no longer is compatible with the intended application, especially as regards resistance to shock and vibrations;

in parallel to the above, once the thickness of plate 14 has been determined, the thickness of the sapphire plate 11 is determined by the method of finite elements applied to calculating the expansions and warping of the focal plane. More specifically, by means of this well known method, the minimum thickness of the sapphire plate 11 is obtained, resulting in indium-microsphere warps no more than 1%.

Accordingly there is no unique solution, however the most logical and most economical implementation must lead to identical results, namely in minimizing the selected thicknesses in view of considerations of mass and heat transfer.

Sealing between the cold plane 5 and the cold conduit 4 of the cryostat is assured, by brazing it into a hermetic seal, of which the nature depends on the technology employed for cooling. Accordingly this cold plane 5 may be made of molybdenum, titanium, sapphire, glass, kovar (Westinghouse TM denoting a metal alloy of 54% iron, 29% nickel and 17% cobalt), even stainless steel.

In the second embodiment of the invention, which is discussed below in relation to FIG. 4, and wherein the detection unit evinces the same design as in the previous example, an interconnection circuit 16 made of polycrystalline alumina or of sapphire is disposed between said detection unit and the cold plane 5 of a cryostat. This intermediary integral component 16 is 2.5 mm thick, this thickness also being determined by the procedure of finite elements. This component 16 on its upper surface and in contact with the readout circuit 7, comprises a layer of epoxy glue 17 which where called for includes a metal filler and which joins said readout circuit 7 to the intermediary component 16, and it further comprises at its lower surface in contact with the cold plane 5 a layer of silicone glue 18 joining it to said cold plane.

Making use of such an intermediary component 2.5 mm thick instead of the intermediary components of the prior art which typically are 0.635 mm thick, and are sold for instance by the firm of MIC TECHNOLOGIE, allows simpler implementation than in the previously described embodiment, but against the tradeoff of slightly worse results because the elongation of the most stressed indium microspheres reaches 5%. However, such elongation must be compared with those of said indium microspheres in the framework of the standard designs of the prior art, which for instance employ a 0.635 mm thick alumina plate, and for which the microsphere elongation is nearly 20% (these results relate to calculation for an embodiment of indium microspheres about 30 $\mu$ in diameter).

It is observed therefore, that when thermal changes take place, the warping of the indium microspheres is reduced to nought, along the direction parallel to the elements, that is along the optic axis of the detector, and will be insignificant and typically less than a micron in the plane of said element, that is in the plane perpendicular to the detector optic axis.

Consequently the implementation of the invention divorces the sealing function of the cold plane from the interconnection function of the focal plane contrary to the case of the prior art, and in particular to the disclosure found in the U.S. Pat. No. 5,111,050.

In this manner it is now possible to reduce and even to eliminate the warps in indium microspheres which are intrinsic to differential expansions, and thereby to ensure higher reliability and strength in the detectors designed in such manner.

Thus the invention offers the following advantages:

First, it allows defining focal planes fitting any type of cryostat, whether such a cryostat be metal or glass.

Also the invention allows using detectors mounted in conventional cryostats cooled by the Joule-Thomson expansion or in Stirling engines, further detectors used in integrated Stirling engines wherein the said detector is directly mounted on the cold conduit of said engine.

Moreover, the intermediary component used in the invention is independent of the cryostat output connection system. In other words, a cryostat with flexible leads can be used just as well as the direct wire outputs or conductors engraved on the cold cryostat glass conduit, for instance by silk-screening.

Lastly, the invention allows matching the intermediary component to the detector geometry and as a result both linear strips and matrices may be processed for detection.

We claim:

1. A method for assembling an infrared radiation detection unit in which an electronic detection circuit is connected with a readout circuit, comprising, affixing an intermediary component to said readout circuit, affixing said intermediary component to a thermally conducting support, and before affixing said readout circuit, intermediary component and support together, selecting the thickness of the intermediary component so that the differential thermal expansion characteristics of said readout circuit, intermediary component and support are sufficiently matched so that the readout circuit is not impaired by thermal expansion or contraction of the assembled unit, and placing the thermally conducting support in contact with a cold source.

2. A method according to claim 1 wherein the intermediary component is comprised of two parallel plates, said method further comprising the steps of:

electrically connecting and mechanically attaching a first of said two parallel plates to the readout circuit by bonding with a conducting epoxy resin;

mechanically attaching a second of said two parallel plates to the support;

attaching said two parallel plates to each other by silicone glue.

3. A method according to claim 1, wherein the intermediary component is formed of a single element.

4. A method according to claim 1, wherein the intermediary component is made of a material having a mean linear expansion coefficient defined as the ratio of the integral of the relative variation in length of the intermediary component between the limits of the ambient temperature and an operating temperature of the detection unit to this temperature interval, said mean linear expansion coefficient being larger than both the mean linear expansion coefficients of the readout circuit, and the support.

5. A method according to claim 1, wherein the intermediary component is made of a material selected from the group consisting of polycrystalline alumina, sapphire, aluminum nitride, passivated silicon, and silicon carbide.

6. A detector of infrared radiation, comprising:
   a detection unit incorporated inside a cryostatic enclosure;
   said detection unit comprising:
      a detection circuit for said infrared radiation;
      a readout circuit, electrically and mechanically connected by indium microspheres to said detection circuit;
      a cold plane affixed to a cold conduit of a cryogenic system;
      an intermediary component adhesively bonded to the readout circuit and to the cold plane wherein the intermediary component is formed from a single element having dimensions that are dependent upon that of the readout circuit to which said intermediary component is joined, such that the intrinsic differential expansion effects of each of the readout circuit, intermediary component and cold plane are compensated, said intermediary component being affixed by an epoxy glue joint to the readout circuit and by a silicone glue joint to the cold plane.

7. A detector of infrared radiation according to claim 6 wherein the intermediary component is made of a material having a mean linear expansion coefficient, defined as the ratio of the integral of the relative length variation of the material of the intermediary component between the limits of ambient temperature and an operational temperature of the detector to this temperature interval, said mean linear expansion coefficient being larger than both the mean linear expansion coefficient of the readout circuit, and the cold plane.

8. A detector of infrared radiation according to claim 6, wherein the intermediary component is made of a material selected from the group consisting of polycrystalline aluminum, sapphire, aluminum nitride, passivated silicon, and silicon carbide.

9. A detector of infrared radiation, comprising:
   a detection unit incorporated inside a cryostatic enclosure;
   said detection unit comprising:
      a detection circuit for said infrared radiation;
      a readout circuit, electrically and mechanically connected through indium microspheres to said detection circuit;
      a cold plane affixed to a cold conduit of a cryogenic system;
      an intermediary component adhesively bonded to the readout circuit and to the cold plane wherein the intermediary component comprises two mutually parallel plates, an upper plate joined mechanically and electrically by a conducting epoxy-glue to the readout circuit, and a lower plate affixed by a silicone-glue joint to said upper plate, said lower plate adhesively joined to the cold plane, the materials and the thicknesses of said two mutually parallel plates depending on that of the readout circuit, such that the intrinsic effects of differential expansion of each of the readout circuit, intermediary component and cold plane are compensated.

10. A detector of infrared radiation according to claim 9, wherein the upper plate of the intermediary component is made of a material having a mean linear expansion coefficient, defined as the ratio of the integral of the relative length variation of the upper plate between the limits of ambient and operational temperatures to said temperature interval, and said mean linear expansion coefficient being larger than both the mean linear expansion coefficients of the readout circuit, and the lower plate.

11. A detector of infrared radiation according to claim 10, wherein the lower plate of the intermediary component is made of a material having a mean linear expansion coefficient close to that of the readout circuit.

* * * * *